(12) United States Patent
Nisbet et al.

(10) Patent No.: US 8,729,949 B2
(45) Date of Patent: *May 20, 2014

(54) SWITCHING CIRCUIT

(71) Applicant: SiGe Semiconductor, Inc., Ottawa (CA)

(72) Inventors: John Jackson Nisbet, Nepean (CA); Michael Joseph McPartlin, North Andover, MA (US); Chun-Wen Paul Huang, Methuen, MA (US)

(73) Assignee: SiGe Semiconductor, Inc., Ottawa, ON ( * ) Notice: Subject to any disclaimer, the term of this patent is extended or adjusted under 35 U.S.C. 154(b) by 0 days.

This patent is subject to a terminal disclaimer.

(21) Appl. No.: 13/894,773

(22) Filed: May 15, 2013

(65) Prior Publication Data

US 2013/0260698 A1   Oct. 3, 2013

Related U.S. Application Data

(63) Continuation of application No. 12/493,437, filed on Jun. 29, 2009, now Pat. No. 8,451,044.

(51) Int. Cl.
 *H03L 5/00* (2006.01)
 *H03K 5/08* (2006.01)
(52) U.S. Cl.
 USPC ............................ 327/308; 327/309; 333/104
(58) Field of Classification Search
 USPC ................... 327/308, 309; 333/104
 See application file for complete search history.

(56) References Cited

U.S. PATENT DOCUMENTS

| | | | |
|---|---|---|---|
| 5,945,867 A * | 8/1999 | Uda et al. | 327/431 |
| 6,066,993 A * | 5/2000 | Yamamoto et al. | 333/103 |
| 6,642,578 B1 | 11/2003 | Arnold et al. | |
| 6,804,502 B2 | 10/2004 | Burgener et al. | |
| 7,199,635 B2 * | 4/2007 | Nakatsuka et al. | 327/308 |
| 7,221,207 B2 * | 5/2007 | Fukumoto et al. | 327/365 |
| 7,345,545 B2 * | 3/2008 | Glass et al. | 330/277 |
| 7,619,462 B2 * | 11/2009 | Kelly et al. | 327/427 |
| 7,636,004 B2 | 12/2009 | Nakatsuka et al. | |
| 2006/0199563 A1 * | 9/2006 | Kelly et al. | 455/333 |
| 2006/0217078 A1 * | 9/2006 | Glass et al. | 455/78 |
| 2009/0167409 A1 | 7/2009 | Suko et al. | |
| 2010/0117713 A1 * | 5/2010 | Katoh et al. | 327/427 |

* cited by examiner

*Primary Examiner* — Ryan Jager

(74) *Attorney, Agent, or Firm* — Knobbe, Martens, Olson & Bear, LLP

(57) ABSTRACT

A method for controlling a switch based on transistors is disclosed. A switching circuit for switching a signal from an input port to an output port thereof is provided. A shunting circuit for switchably shunting the signal from the input port to ground is also provided. A control signal is generated for biasing a control port of the shunting circuit and an approximately complimentary control signal is generated for biasing of the switching circuit to either shunt a signal received at the input port or to switch the signal to the output port. A further bias signal for biasing a port within the switching circuit along the signal path between the input port and the output port is also provided.

20 Claims, 7 Drawing Sheets

SWITCHING CIRCUIT

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

FIELD OF THE INVENTION

The invention relates to microwave integrated circuits, and more particularly to an enhancement of microwave switch circuits.

BACKGROUND

In recent years, the use of wireless and RF technology has increased dramatically. The number of cellular telephone subscribers alone worldwide is expected to reach 3 billion by the end of 2008 according to the International Telecommunication Union (ITU). Similarly the devices incorporating wireless technology have expanded, and continue to so. It is anticipated that the overall market for other wireless devices will exceed cellular telephone units as consumers procure multiple devices per household.

Wireless devices interface to wireless infrastructures that support data, voice and other services via one or more standards. Some examples of wireless standards in significant deployment today include:

WiFi [ANSI/IEEE Standard 802.11];
WiMAX [IEEE Standard 802.16];
Bluetooth [IEEE Standard 802.15.1];
Industrial, Scientific and Medical (ISM) [International Telecommunications Union Recommendations 5.138, 5.150, and 5.280]; and
GSM 850/9001180011900 [European Telecommunications Standards Institute (ETSI)] and its extensions General Packet Radio Service (GPRS) and Enhanced Datarates for GSM Evolution (EDGE).

Pricing of finished products is often a major factor in the commercial success of products. Accordingly, monolithic integration of the electronics to result in devices with low parts count—a small number of integrated circuits (ICs)—is common practice. In fact, a typical RF system will comprise a baseband controller IC, a radio receiver and transmitter, and an RF signal front-end that may include power amplifiers, low-noise amplifiers, switches, and filters amongst other possible signal conditioning blocks. These integrated circuits are manufactured using a silicon-based technology platform for baseband elements of the circuit that are 'logic' intensive and, typically, from silicon germanium, gallium arsenide, and indium phosphide for many RF circuit elements that condition the incoming or outgoing radio signal primarily in the analog or RF domain. The RF circuit elements form a microwave circuit path from the RF signal mixers that are up converting or downconverting the RF signals via amplifiers, microwave filters, circulators, etc. The RF signal is, of course, received from or transmitted to an RF antenna or other load such as a co-axial cable. An RF antenna or cable is an RF load for the transmitting circuit or RF signal front-end. Moreover, a collection of RF circuit elements might be manifested in the form of a monolithic microwave integrated circuit (MMIC) and may be part of the RF front-end in the form of a module.

Within many wireless consumer electronics products that are intended to receive or transmit information is a transmit/receive switch circuit that selectively connects a microwave transmission circuit to the RF load of the consumer electronics product and a microwave receiver circuit to the antenna or cable, such a switch circuit being a Single Pole Double Throw (SPDT) switch. The microwave transmission circuit and microwave receiver circuit are often a single bidirectional transmit/receive circuit. In other instances where the wireless consumer electronic product operates with multiple wireless standards there may be a separate microwave transmission circuit and microwave receiver circuit for each of the wireless standards supported. For example a wireless device supporting two wireless standards requiring different MMIC technologies for each, such as IEEE 802.11a at 5 GHz and IEEE 802.16 at 2.4 GHz, would have a Single Pole Quadruple Throw (SPQT) wherein a single common antenna or cable port is selectively coupled to one of two possible transmitter connections and a corresponding one of two receiver connections.

Conventionally, high-performance RF/microwave switches are implemented with depletion-mode GaAs MESFETs or PHEMTs. These devices are chosen because they offer very low $R_{on}$ and $C_{off}$ per unit gate width; these parameters determine switch insertion loss and isolation. The transistor is turned on by biasing Vgs>Vp, where Vp is the pinchoff voltage and Vp<0 for a depletion-mode device. The transistor is turned off by biasing Vgs<Vp, where a typical value of Vp might be −1.0 V. So $Vgs_{on}$ might be 0 V and $Vgs_{off}$ might be −2 V. This is accomplished, for example, by biasing the source and drain at 2 V and switching the gate to 0 V (off) or 2 V (on).

The D-mode GaAs FET or PHEMT has three major disadvantages for use as a high-performance switch. First is the tendency of gate current to flow when Vgs>0; the gate forms a Schottky diode to the channel which can turn on for large signal levels or inappropriate bias. Gate current flow leads to sharply increased loss and distortion in the switch. A second disadvantage is the absence of a complementary device type (p-channel FET); without a PFET, logic functions consume more power and die area. In some circuits it is difficult to control the switch using standard low-voltage CMOS levels. A third disadvantage is resulting higher die cost per unit area, which is aggravated by the relatively primitive and area-intensive ESD protection structures available in most GaAs FET processes.

Silicon-based RF/microwave switches that use the CMOS device as the core switch element are attractive because of the integration potential of combining both logic and RF functionality. In addition, the relatively low cost when compared to GaAs-based devices makes such Silicon-based RF/microwave switches attractive for the consumer electronics market. The conventional biasing arrangement and topology of an RF/microwave switch is, however, similar when the switch is manufactured using a Silicon-based CMOS technology or GaAs.

It is therefore a goal of the invention to overcome at least some of the limitations of the prior art.

SUMMARY OF THE INVENTION

In accordance with the invention there is provided a circuit comprising: a first RF switch operable in a first mode and in a second other mode, the RF switch comprising: an input port for receiving an RF signal, an output port for in the first mode providing the RF signal and in the second other mode other than providing the RF signal, a shunt switch for in the second other mode shunting the RF signal to ground and in the first mode for other than shunting the RF signal to ground, and a switch for in the first mode conducting the RF signal between the input port and the output port and in the second other mode other than conducting the RF signal between the input port and the output port; and a controller comprising a switching circuit for providing simultaneously a plurality of control signals comprising: a first signal for biasing the switch between the first mode and the second other mode; an approximately complimentary signal for biasing the shunt switch between the second other mode and the first mode; and a biasing signal for biasing one of a source and a drain of the switch approximately in accordance with the approximately complimentary signal.

In accordance with another embodiment of the invention there is provided a method comprising: providing a switching circuit for switching a signal from an input port to an output port thereof; providing a shunting circuit for switchably shunting the signal from the input port to ground; providing a control signal for biasing a control port of the shunting circuit and an approximately complimentary control signal for biasing of a control port of the switching circuit to either shunt a signal received at the input port or to switch the signal to the output port; and, providing a bias signal for biasing a port within the switching circuit along the signal path between the input port and the output port.

BRIEF DESCRIPTION OF THE DRAWINGS

Exemplary embodiments of the invention will now be described in conjunction with the following drawings, in which.

DETAILED DESCRIPTION

Figure 1A:
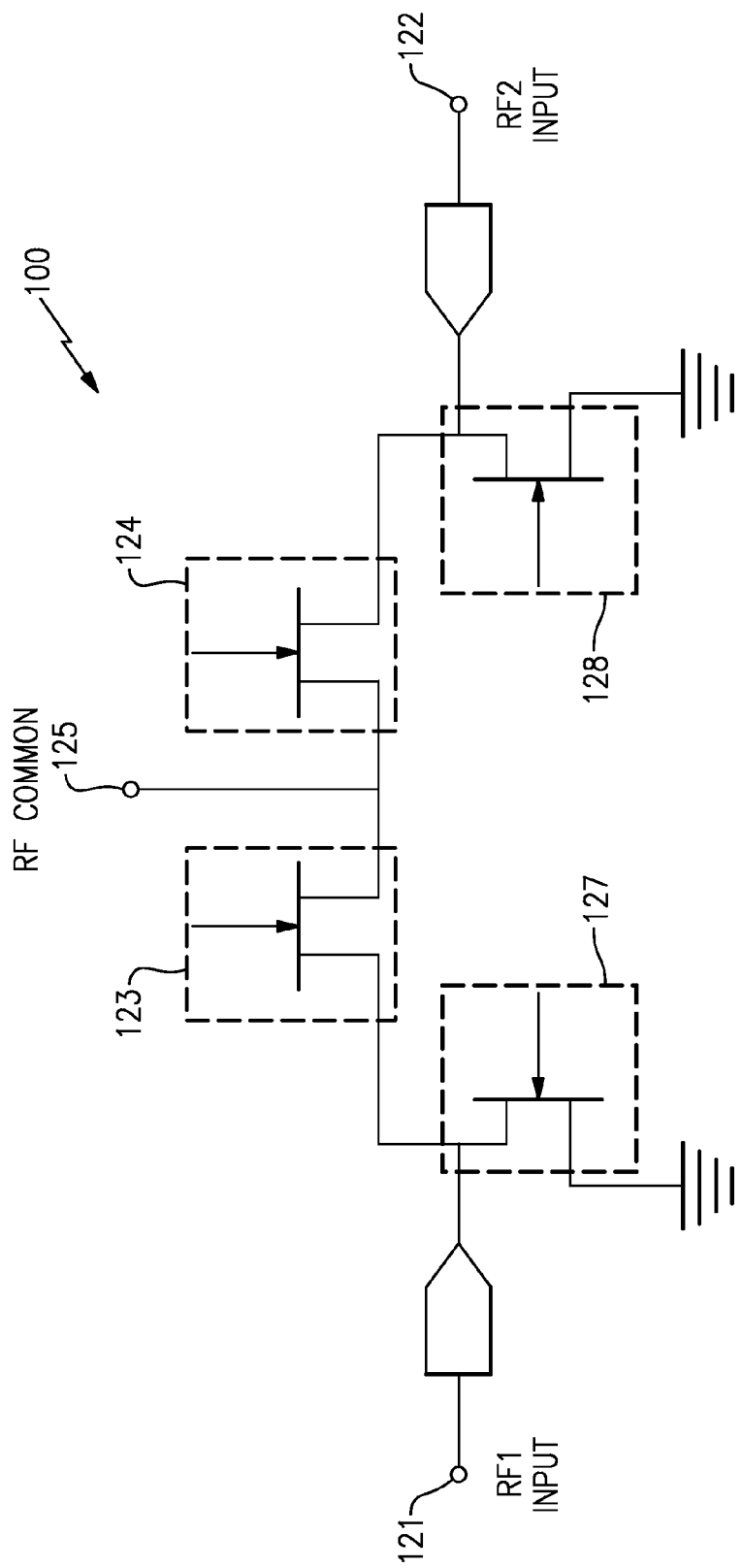
FIG. 1A illustrates a simple prior art microwave switch circuit according to Bergener et al.

Referring to FIG. 1A there is shown a simple prior art microwave switch circuit 100 according to Bergener et al (U.S. Pat. No. 6,804,502). The microwave switch circuit 100 comprises four MOSFET transistors 123, 124, 127 and 128. The transistors 123 and 124 act as "pass" or "switching" transistors, and are configured to couple respective RF input nodes RF 1 Input 121 and RF2 Input 122 to a common RF node RF Common 125. For example, when enabled—switched "on," the switching transistor 123 couples a first RF signal applied to RF node RF1 Input port 121 to the RF common node RF Common 125. Similarly, when enabled, the switching transistor 124 couples a second RF signal applied to second RF node RF2 Input port 122, to the RF common node RF Common 125. The shunting transistors, 127 and 128, when enabled, act to shunt the respective RF signals to ground when their associated RF nodes are uncoupled from the RF common node RF Common 125. This uncoupling occurs when the respective switching transistor, switching transistor 123 or switching transistor 124, is electrically connected to the associated node RF1 Input 121 or RF2 Input 122 is turned "off."

Figure 1B:
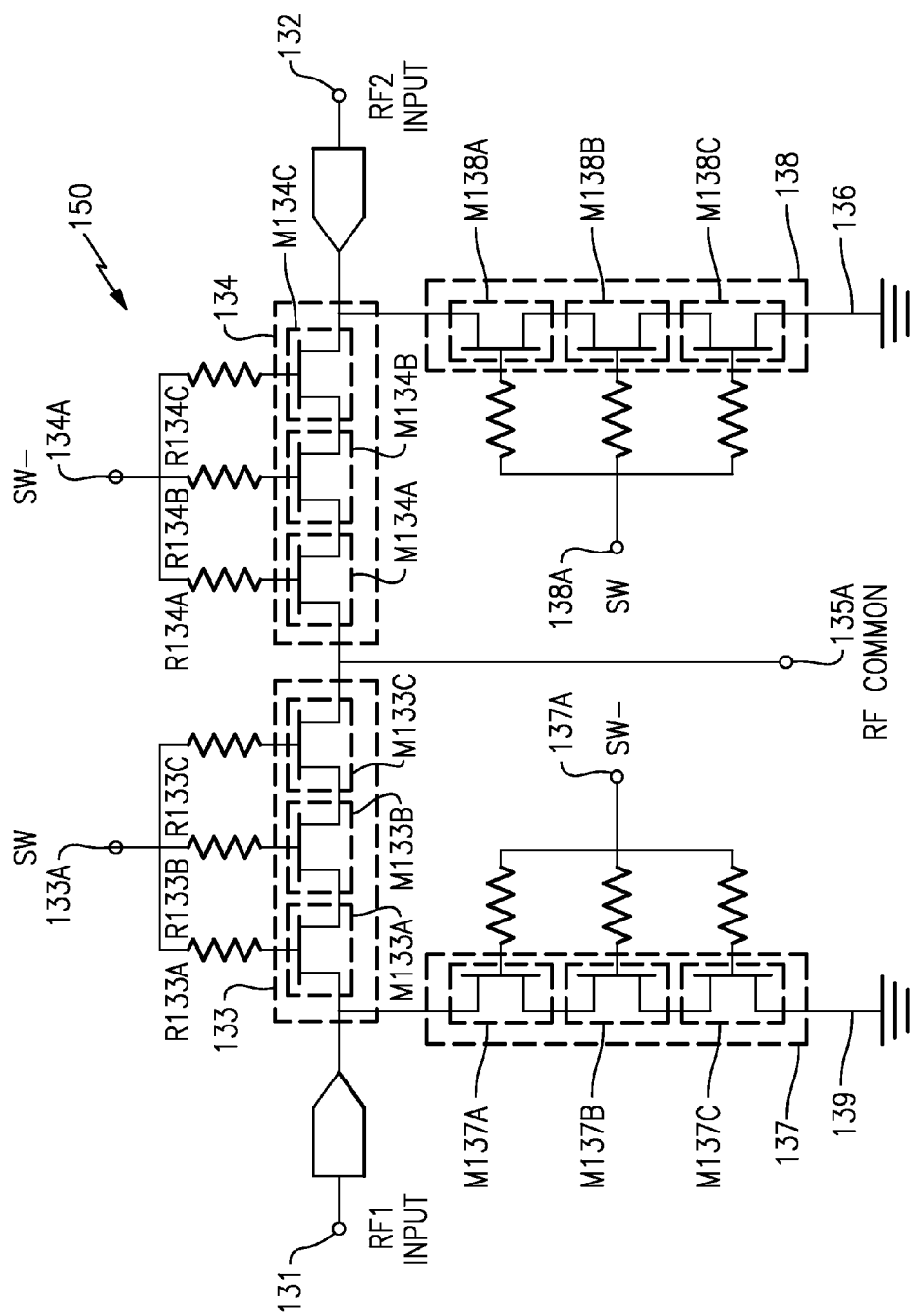
FIG. 1B illustrates a typical prior art microwave switch circuit according to Bergener et al.

Such a microwave switch circuit 100 when implemented using bulk silicon CMOS RF switches disadvantageously exhibits high insertion loss, low compression, and poor linearity performance characteristics. In contrast, implementing microwave switch circuit 100 with gallium arsenide (GaAs) semiconductor technology overcomes this as the semi-insulating GaAs substrate material results in parasitic substrate resistances being greatly reduced, thereby reducing RF switch insertion loss. Similarly, the semi-insulating GaAs substrate improves switch isolation. GaAs whilst offering improved performance compared with Si CMOS disadvantageously has higher manufacturing costs. As such it would be beneficial to enhance the performance of Si CMOS RF microwave switches. Referring to FIG. 1B illustrated is a prior art microwave switch circuit 150 according to Bergener et al that attempts to redress the performance issues of Si CMOS.

The microwave switch circuit 150 comprises four clusters or "groupings" of MOSFET transistors, identified in FIG. 1B as transistor groupings 133, 134, 137 and 138. Two transistor groupings comprise "pass" or "switching" transistor groupings 133 and 134, and two transistor groupings comprise shunting transistor groupings 137 and 138. Each transistor grouping comprises three MOSFET transistors arranged in a serial configuration. For example, in the embodiment shown in FIG. 1B, the switching grouping 133 includes three switching transistors, M133A, M133B, and M133C. Similarly, the switching grouping 134 includes three switching transistors, M134A, M134B, and M134C. The shunting grouping 137 includes three transistors M137A, M137B, and M137C. Similarly, the shunting grouping 138 includes three transistors, M138A, M138B, and M138C.

As shown in FIG. 1B, microwave switch circuit 150 is controlled by two control signals, SW, and its inverse, SW−. These control signals are coupled to the gates of their respective transistors through gate resistors. For example, the control signal SW controls the operation of the three transistors in the switching transistor grouping 133, M133A, M133B, and M133C, through gate resistors, R133A, R133B, and R133C, respectively. The control signal SW propagates to the switching transistor grouping 133 via input node 133A, and is also provided to input node 138A to control the shunting transistor grouping 138. Similarly, the inverse of SW, SW−, controls the switching transistor grouping 134 via input node 134. SW− is also provided to input node 137A to control the shunting transistor grouping 137. SW− is similarly applied to the transistors M134A, M134B, and M134C of switching transistor grouping 134 via three gate resistors, R134A, R134B, and R134C, respectively.

The switching transistor groupings 133 and 134 act as pass or switching transistors, and are configured to alternatively couple RF nodes, RF1 Input port 131 and RF2 Input port 132, to a common RF node RF Common 135. For example, when enabled, the switching transistor grouping 133 couples an RF signal applied to RF input node RF1 Input port 131 to the RF common node RF Common 135. Similarly, when enabled, the switching transistor grouping 134 couples a RF signal from the RF node RF2 Input port 132 to the RF common node RF Common 135. The shunting transistor groupings, 137 and 138, when enabled, act to shunt signals from the RF input nodes to ground when their associated RF nodes are uncoupled from the RF common node, i.e., when the switching transistor grouping, 133 or 134, that is electrically connected to the associated input node is turned "off."

As taught by Bergener the microwave switch circuit 150 is not manufactured using a conventional Si CMOS manufacturing methodology. Rather the MOSFET transistors within the transistors groupings 133, 134, 137 and 138 are implemented using a fully insulating substrate silicon-on-insulator (SOI) technology. More specifically, Bergener teaches using "Ultra-Thin-Silicon" (UTSi), which is also known as Ultrathin Silicon-on-Sapphire due to the use of thin film silicon on a sapphire substrate rather than a silicon wafer. The fully insulating sapphire substrate enhances the performance characteristics of the RF switch by reducing the deleterious substrate coupling effects associated with non-insulating and partially insulating substrates. For example, improvements in insertion loss are realized by lowering the transistor "on" resistances and by reducing parasitic substrate resistances. In addition, switch isolation is improved using the fully insulating substrates provided by UTSi technology. Owing to the fully insulating nature of silicon-on-sapphire technology, the parasitic capacitance between the nodes of the microwave switch circuit 150 is greatly reduced as compared with bulk CMOS and other traditional integrated circuit manufacturing technologies.

Figure 2:
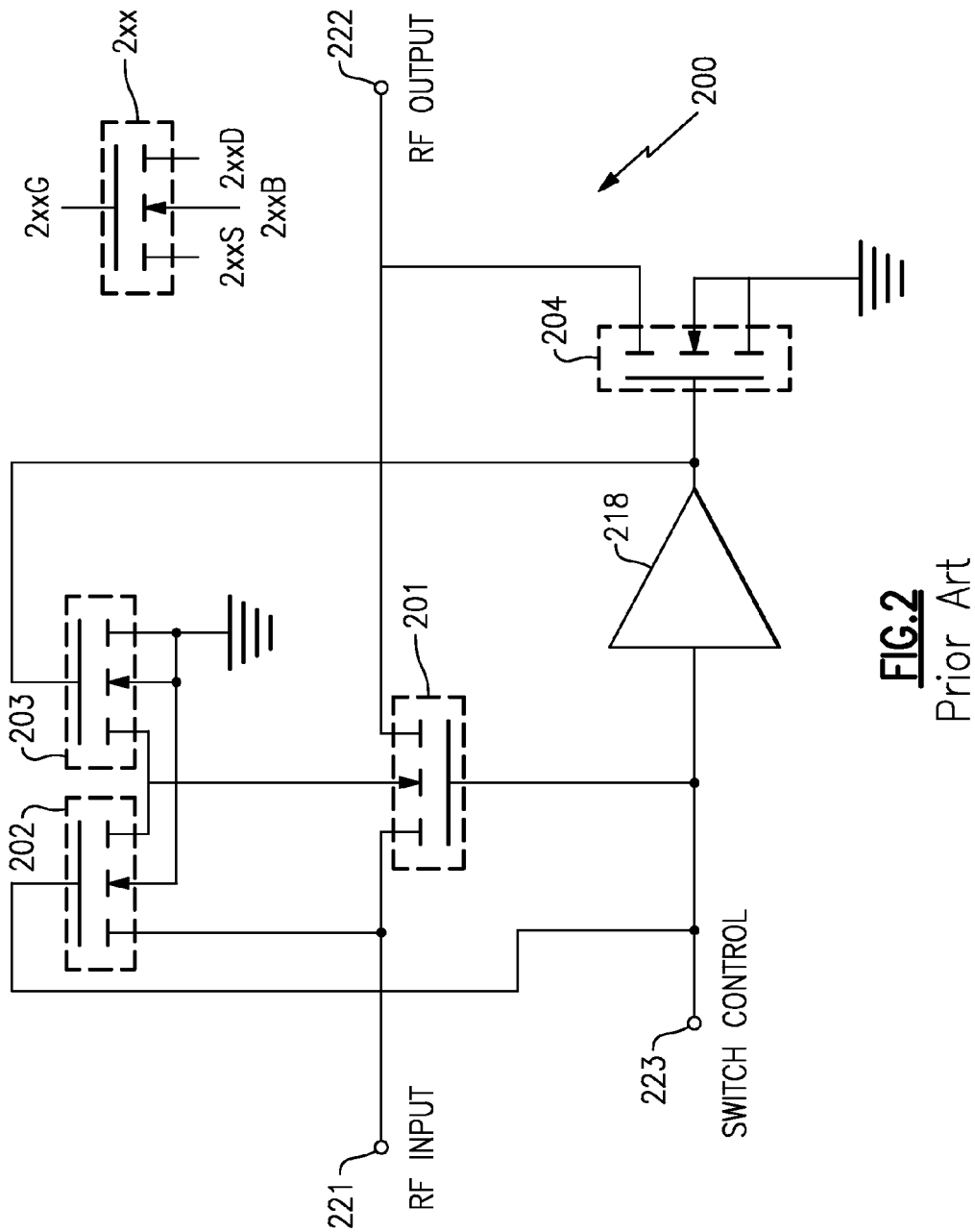
FIG. 2 illustrates a prior art microwave switch according to Burghartz.

However, whilst Bergener teaches a CMOS circuit, it is still one manufactured using unconventional manufacturing technology different from the bulk of low cost Si CMOS, which employs a low resistivity silicon substrate. An alternative approach is shown in respect of FIG. 2, which illustrates a prior art microwave switch 200 according to Burghartz. The microwave switch 200 as shown is an SPST switch that includes a port, RF input port 221, where an RF signal is applied to the microwave switch 200, an output port, RF Output port 222, and a switch control port 223 which receives a bias signal for controlling an ON and OFF status of the switch. The RF signal appears at output port 222 with low insertion loss in the ON state, and with high insertion loss in the OFF state.

First FET 201 is electrically connected to both the RF Input port 221 and RF Output port 222 and includes gate 201G, source 201S, drain 201D, and back gate contact 201B. First FET 201 as well as the other FETs 202, 203, and 204 are silicon MOSFETs operating in depletion mode. Gate 201G of first FET 201 is electrically connected to switch control port 223, the source 201S to the RF input port 221, and the drain 201D to the RF output port 222. The back gate contact 201B is coupled to source 203S and drain 204D of second and third FETs 202 and 203. Drain 202D of second FET 202 is electrically connected to RF Input port 221, while the source 203S of third FET is electrically connected to ground potential. The respective back gate contacts 202B and 203B of the second and third FETs 202 and 203 are commonly electrically connected to ground.

The gate 202G of second FET 202 is electrically connected to switch control port 223, while gate 203G of third FET 203 is electrically connected to the output port of inverter 218. The input signal port of the inverter 218 is electrically connected to switch control port 223. The output port of the inverter 218 is electrically connected to the gate 204G of the fourth FET 204, the shunt FET, which has its source 204S and back gate 204B at ground and its drain 204D coupled to RF output 222. In the ON-state of the microwave switch 200, a bias control signal applied to switch control port 223 is in a first state, e.g., VGS=0V, thereby turning first and second FETs 201 and 2020N. Also, third and fourth FETs 203 and 204 are each OFF, since inverter 118 provides bias of opposite state to the gates 203G and 204G of third and fourth FETs 203 and 204, respectively. With second FET 2020N, the back gate 201B and source 201S of the first FET 201 are electrically connected together through the second FET 202. This electrical connection of source 201S and back gate 201B regions minimizes the on-resistance of first FET 201. Also, in the ON state, third FET 203 is off and thus presents high shunt impedance, which limits additional loss for the microwave switch 200. In the OFF state of the microwave switch 200, the bias control signal applied to switch control port 223 is in the opposite state, and hence first and second FETs 201 and 202 are OFF while third and fourth FETs 203 and 204 are ON. As a result, back gate contact 201B is connected via third FET 203 to ground potential, as source 203S is at ground potential. This maximizes the off-resistance of the series FET, first FET 201. Also fourth FET 204 is ON, which increases the isolation, insertion loss, of the overall microwave switch 200 in the OFF state, since an RF short to ground is provided for coupling most of the power that leaks through first FET 201 to ground and not the RF output port 222.

Insertion loss within a microwave switch such as prior art switch 200 is least when the FETs within the switching group, i.e. first FET 201, are driven to their hardest ON state. Similarly highest isolation occurs when the FETs within the switching group are driven to their hardest OFF state and the shunt group, i.e. fourth FET 204, are driven to their hardest ON state. An exemplary embodiment of the invention for applying ON/OFF drive to the switching and shunt FETs is shown by microwave switch circuit 300. As shown an antenna 355 is intended for connection to one of three circuits, namely Tx circuit 385, Rx circuit 365, and test circuit 375. Disposed between each of these three circuits and the antenna 355 are switching circuits 310, 360 and 370, respectively.

Considering the first switching circuit 310, which is often typical of all three switching circuits 310, 360 and 370, then the switching path between the antenna 355 and Tx circuit 385 comprises first decoupling capacitor 321, first through third switching FETs 331 through 333, and second decoupling capacitor 324. The first through third switching FETs 331, 332, and 333 are cascaded drain to source, and for each their gate contact is electrically coupled to a second output port 350B of a switch controller 350 via resistors 312, 313, and 314, respectively. The drain of the FET 331 is also electrically coupled via a resistor 311 to a first output port 350A of the switch controller 350. The third switching FET 333 has its source capacitively coupled via capacitor 315 to the drain contact of upper FET 341 of shunt transistor grouping comprising upper FET 341, middle FET 342, and lower FET 343. As with the switching transistor grouping, the shunt transistor grouping of FETs 341, 342, and 343 are electrically coupled source contact to drain contact, whilst the source contact of lower FET 343 is capacitively coupled to ground and resistively coupled to port 350B via resistor 391. The gate contacts of upper FET 341, middle FET 342, and lower FET 343 are all electrically coupled to a third output port 350C of the switch controller 350 via resistors 316, 317, and 318, respectively.

The switch controller 350 is controlled from an input port Switch Tx (SWTx) 310A. Also electrically coupled to the switch controller 350 are lower voltage rail $V_{LO}$ at lower voltage port 310C and upper voltage rail $V_{HI}$ at upper voltage port 310B. $V_{HI}$ is provided from a regulator 380 to which upper voltage port 310B is electrically connected via regulator output port 380B. The other regulator output ports 380C and 380D are interconnected to equivalent upper voltage ports within the switching circuits 360 and 370, respectively. Switching circuit 360 is interfaced to the antenna 355 and Rx circuit 365 is controlled via Switch Rx (SWRx) port 360A. Similarly switching circuit 370 disposed between the antenna 355 and test circuit 375 is controlled via Switch (SWBT) port 370A. The regulator 380 is provided with a voltage to be regulated from regulator input port 380A, for example from a battery of a wireless handheld device $V_{BAT}$.

SWTx 310A is electrically coupled to the gates of first and second controller transistors 351 and 353. The drain of first controller transistor 351 is electrically coupled to the upper voltage rail $V_{HI}$, the source of first controller transistor 351 is electrically coupled to the drain of second controller transistor 353, and the drain of second controller transistor 353 is electrically coupled to the lower voltage rail $V_{LO}$. Similarly third and fourth controller transistors 352 and 354, respectively, are disposed between the upper voltage rail $V_{HI}$ and lower voltage rail $V_{LO}$. The gates of the third and fourth controller transistors are electrically coupled to the mid-point drain-source connection between the first and second controller transistors 351 and 353, respectively. First controller output port 350A is also electrically coupled to this mid-point drain-source connection, as is the third controller output port 350C. The second controller output port 350B is electrically coupled to the mid-point drain-source connection between the third and fourth controller transistors 352 and 354, respectively.

Accordingly in operation, if a SWTx low signal is applied to SWTx port 310A this results in the switching FETs 331, 332, and 333 being turned off with source-drain voltage at $V_{HI}$, from first controller output port 350A, and the gates at $V_{LO}$ or ground from second controller output port 350B. In this state, the shunt FETs 341, 342, and 343 are turned on with gate-voltage at $V_{HI}$ from third controller output port 350C, and the source-drain voltage at $V_{LO}$ or ground from second controller output port 350B. If SWTx is high, $V_{HI}$, then the switching FETs are turned on with the source-drain voltage at $V_{LO}$ and the gates biased at $V_{HI}$; the shunt FETs are turned off with gates—at $V_{LO}$ or ground and the source-drain voltage at $V_{HI}$.

As shown in FIG. 3, the drain of a last shunt FET 343 at a fourth controller output port 350D is coupled to a signal complementary to that provided to the gate thereof. Here, the complementary signal is a signal provided to the gates of the switching FETs 331, 332, and 333. This provides a similar advantage for the shunt FET switching as is provided and explained for the switching FET.

Advantageously, each switching circuit, such as first switching circuit 310, provides approximately maximum possible "on" and "off" drive voltages to the FETs in switching and shunt paths. Additionally AC coupling of the switching circuit with respect of the antenna 355 and electrically coupled circuit, i.e. Tx circuit 385, is inherently provided. Optionally the capacitors 321 and 324 are chosen to be resonant with the bond wires interconnecting the switch circuit 300, comprising switching circuit 310, 360 and 370, to the antenna 355, Tx circuit 385, Rx circuit 365, and test circuit 375. For example, for a switch circuit designed to operate at 2.45 GHz where a typical bond wire inductance is 500 pH then these capacitors would be specified at nominal 8.4 pF.

As described supra in respect of microwave switch circuit 300 the regulator 380 provides a regulated output voltage $V_{HI}$ to the regulator output ports 380B, 380C, and 380D which are electrically coupled to the switching circuits 310, 360, and 370, respectively. Optionally, regulator 380 is also interfaced to circuitry that determines whether a switching circuit has been enabled, i.e. has one of SWTx, SWRx, and SWBT been set to enable a respective switching circuit. If none of these three control signals has been enabled, this obviates regulation of voltage such that $V_{HI}$ generated is directly supplied without regulation and the control logic operates with the circuit working at the same voltage levels, namely ground or $V_{LO}$ and $V_{HI}$, so as to ensure no latch-up within the circuit and unwanted power dissipation. Since no average current is drawn from $V_{HI}$ it merely serves as a power supply for static CMOS inverters within the controller circuits such as controller circuit 350.

Figure 3A:
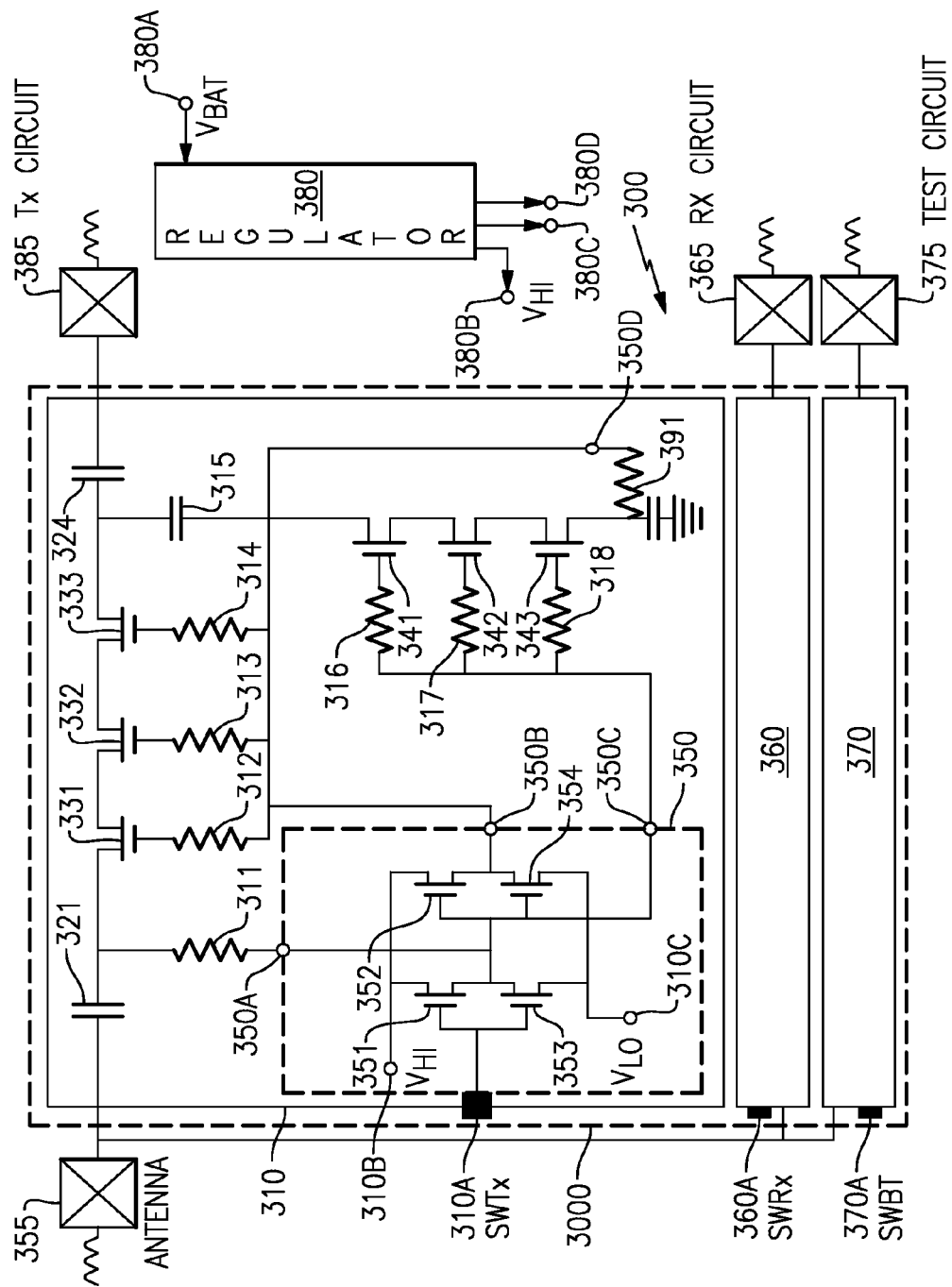
FIG. 3A illustrates an exemplary embodiment of the invention for applying full ON/OFF drive to the RF FETs.
Figure 3B:
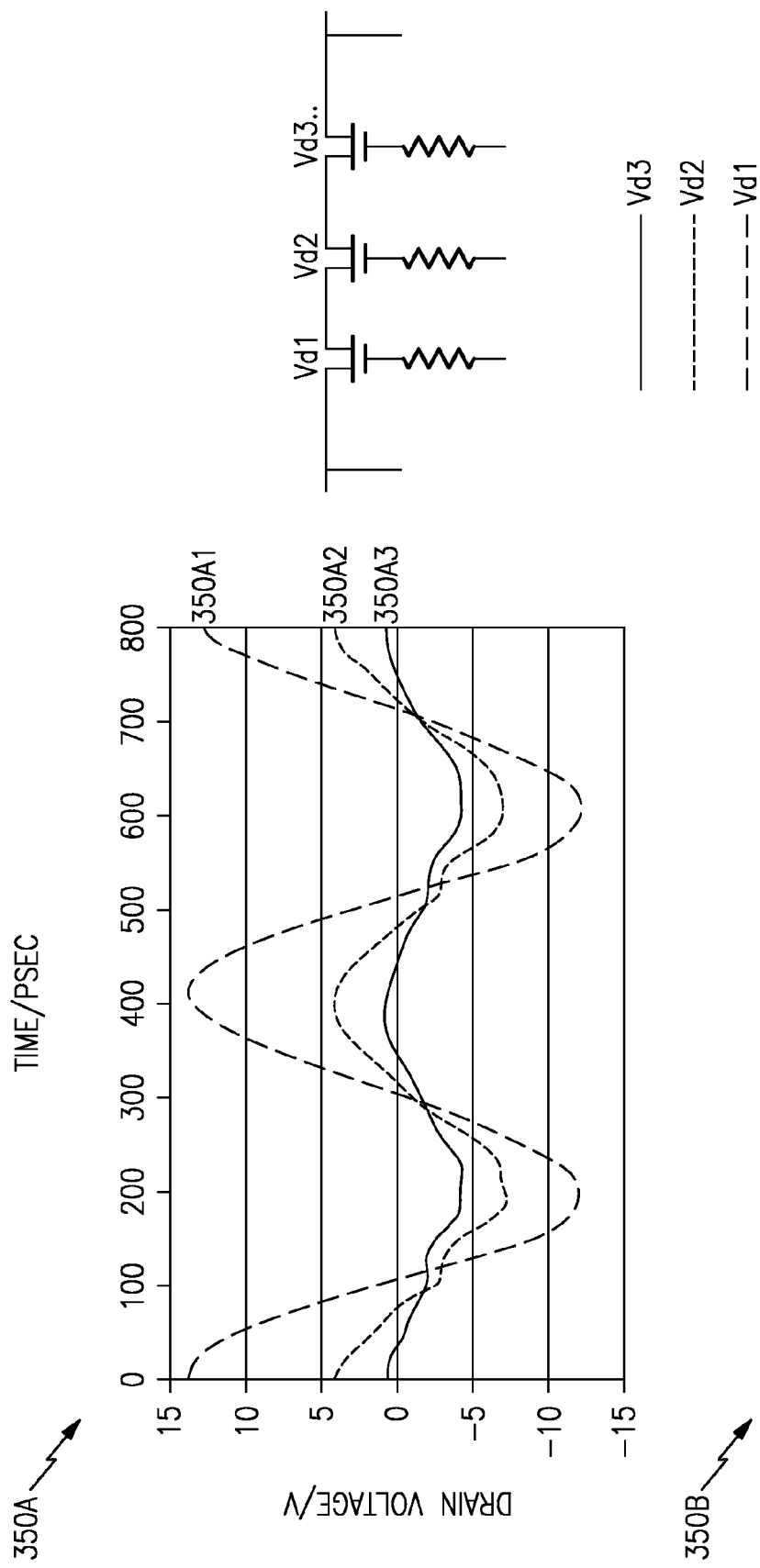
FIG. 3B illustrates a typical performance of the design of FIG. 3A.

Referring to FIG. 3B illustrated is a typical performance according to the design of FIG. 3A. As shown, there is first time-voltage graph 350A depicting voltage at each drain contact within the switching FETs 331, 332, and 333. Hence there is shown first curve 350AI representing drain voltage Vd1 from first switching FET 331, second curve 350A2 representing drain voltage Vd2 from the second switching FET 332, and third curve 350A3 representing drain voltage Vd3 from the third switching FET 333. The voltage appearing at each drain voltage is reduced from first switching curve 350A1, a swing of approximately 26V, to third switching curve 350A3, with a swing of approximately 5V.

Figure 4:
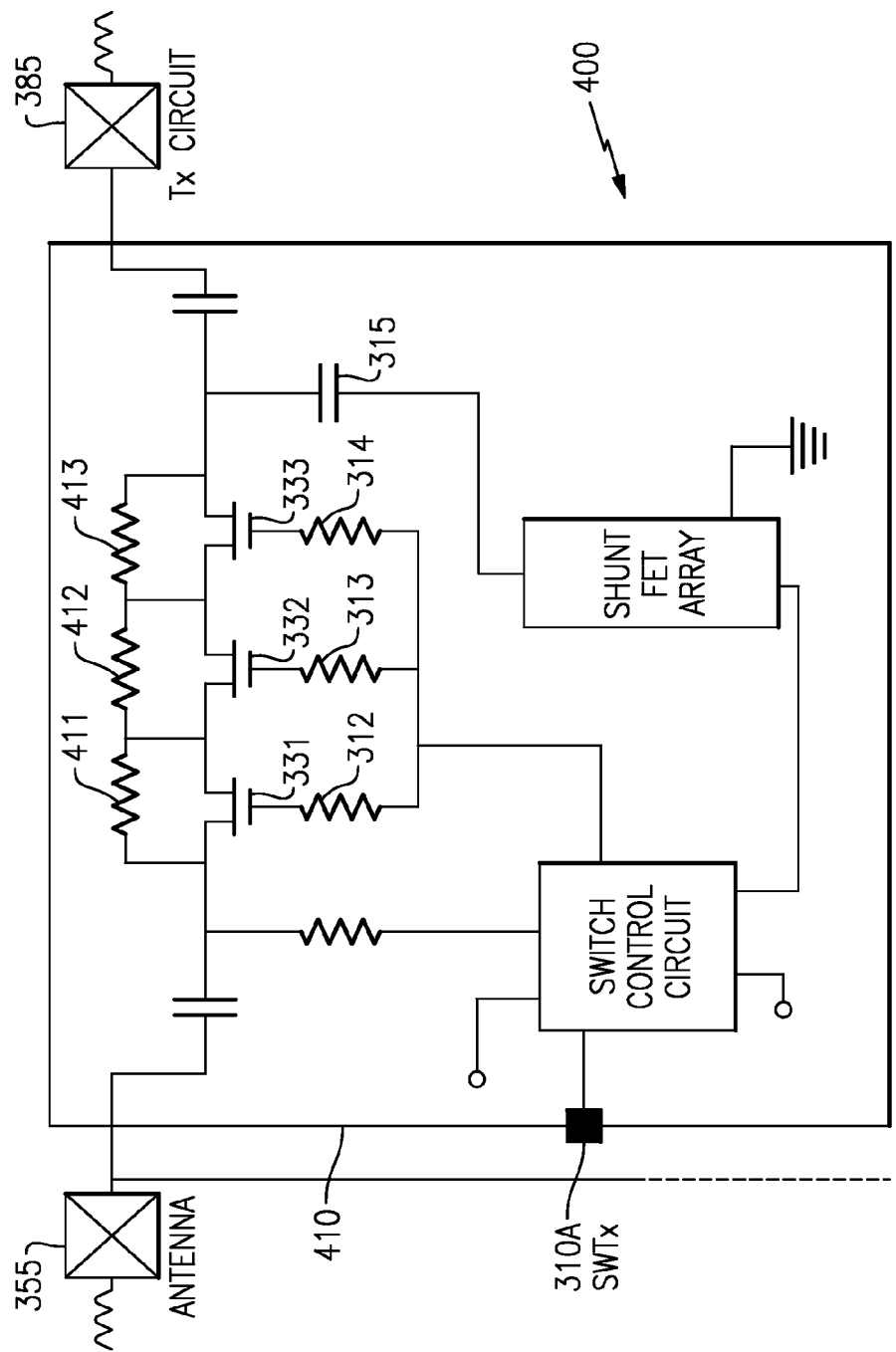
FIG. 4 illustrates an exemplary embodiment of the invention applying drain-source resistors to the series FETs of FIG. 3A.

Referring to FIG. 4 there is illustrated an exemplary embodiment of the invention wherein drain-source resistors are provided to the switching FETs 331, 332 and 333 of FIG. 3A. As shown in microwave switch circuit 400, a single switching circuit 410 is depicted between antenna 355 and Tx circuit 385 and is controlled from SWTx port 310A. The single switching circuit 410 now has resistors 411, 412, and 413 disposed between the drain and source contacts of each of switching FETs 331, 332 and 333, respectively. Properly selected resistors act to reduce harmonic distortion.

Figure 5:
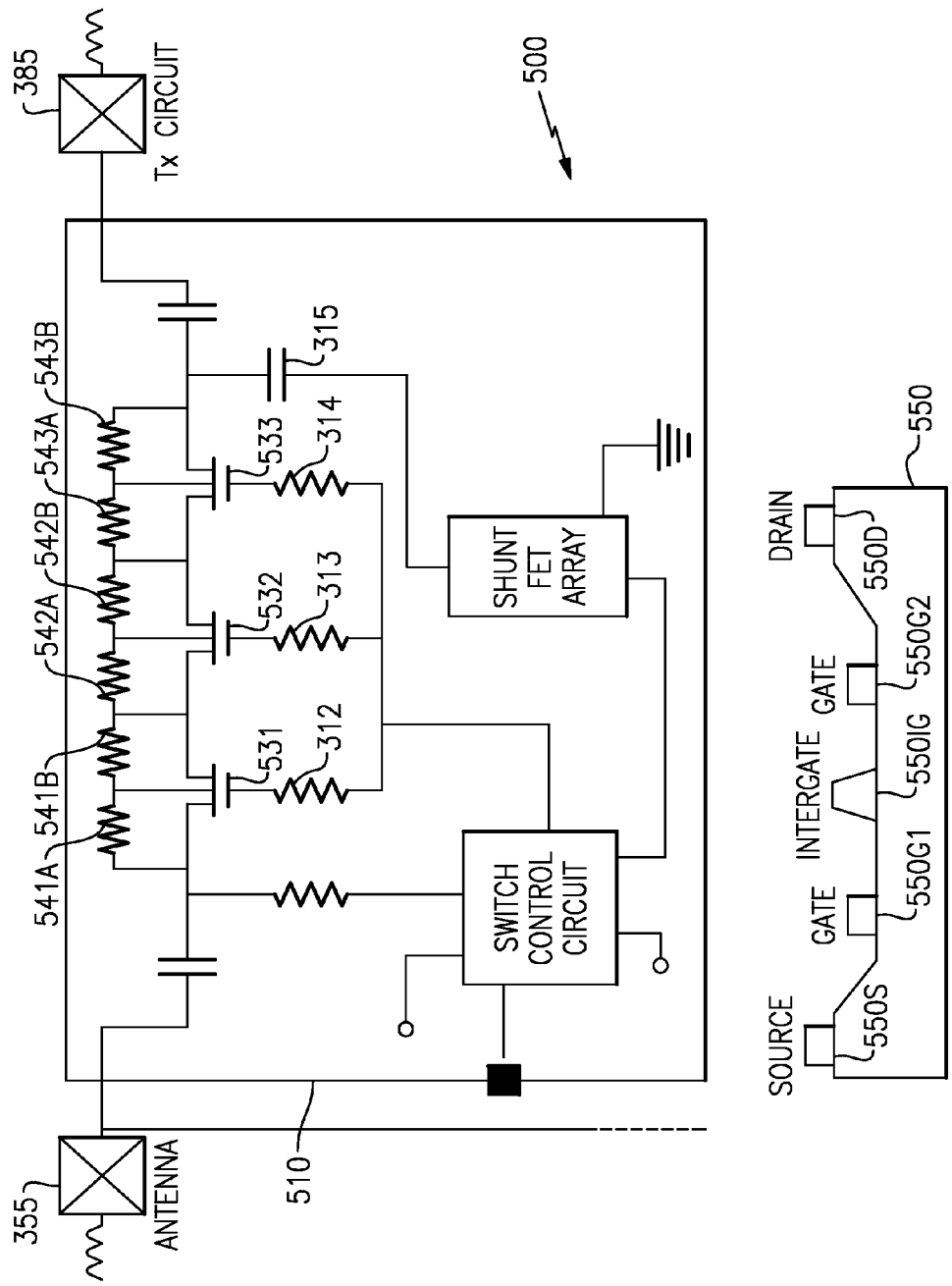
FIG. 5 illustrates an exemplary embodiment of the invention wherein the series FETs of the microwave switch are modified to include inter-gate electrodes.

Referring to FIG. 5 there is illustrated an exemplary embodiment of the invention wherein the switching FETs of the microwave switch are modified to include inter-gate electrodes. As shown microwave switch circuit 500 comprises a switching circuit 510 disposed between antenna 355 and Tx circuit 385. Now each of the switching FETs 531 through 533 is implemented as shown by FET structure 550. As such, the FET structure 550 comprises source contact 550S, drain contact 550D, and gate contacts 550G1 and 550G2. However, now disposed between the gate contacts 550G1 and 550G2 is intergate contact 5501G.

Accordingly, resistors between the drain-source of the switching FETs, such as resistors 411, 412, and 413 of FIG. 4, are replaced by pairs of resistors. Hence first switching FET 531 has first resistor 541A between drain and intergate electrode and second resistor 541B between the intergate electrode and source. Second switching FET 532 has third and fourth resistors 542A and 542B disposed to connect the intergrate contact 550G to the drain and source contacts, and third switching FET 533 has fifth and sixth resistors 543A and 543B disposed to connect the intergate contact 550G to the drain and source contacts. Whilst each switching FET 531 through 533 is depicted with a single resistor 312 through 314 between the gate contacts and the switch control circuit, each gate contact 550G 1 and 550G2 optionally is electrically coupled via a separate resistor (not shown for clarity). Biasing the intergate electrode changes the pinch-off voltage, thereby improving suppression of harmonics further within the switching FETs.

Optionally the switching FET configurations of FIGS. 4 and 5 are applied to the shunt FETs even though harmonic suppression whilst shunting RF power to ground is not typically as important as it is within the switching path. The embodiments herein described are applicable to silicon CMOS based FETs thereby allowing for low cost manufacturing as well as offering integration of the switching circuits with standard Si CMOS transmit/receive circuits.

Numerous other embodiments may be envisaged without departing from the spirit or scope of the invention.

What is claimed is:

1. A radio frequency (RF) device comprising:
a transmit circuit configured to provide an RF signal including transmit information;
an antenna configured to transmit the RF signal; and
a microwave switch configured to provide a switching path between the antenna and the transmit circuit and including at least one switching FET configured to conduct the RF signal between the transmit circuit and the antenna in a first mode of operation, at least one shunt FET configured to shunt the RF signal to ground in a second mode of operation, and a plurality of control switches configured to turn on the at least one shunt FET in the second mode and to turn off the at least one shunt FET in the first mode, to turn off the at least one switching FET in the second mode and to turn on the at least one switching FET in the first mode, to increase a voltage difference between a gate and a drain of the at least one switching FET, and to increase a voltage difference between a gate and a drain of the at least one shunt FET, the at least one switching FET including an intergate electrode disposed between a pair of switching FET gate contacts to bias an intergate region to adjust a characteristic of the at least one switching FET, a first feed-forward resistor electrically coupled to the drain of the at least one switching FET and the intergate electrode, and a second feed-forward resistor coupled to a source of the at least one switching FET and the intergate electrode.

2. The RF device of claim 1 wherein the control switches are configured to provide a first control signal to turn on the at least one switching FET in the first mode, to turn off the at least one switching FET in the second mode, and to increase the voltage difference between the gate and the drain of the at least one shunt FET.

3. The RF device of claim 2 wherein the control switches are further configured to provide a second control signal to turn on the at least one shunt FET in the second mode, to turn off the at least one shunt FET in the first mode, and to increase the voltage difference between the gate and the drain of the at least one switching FET.

4. The RF device of claim 3 wherein the first and second control signals being approximately complementary signals.

5. The RF device of claim 2 wherein the first control signal drives the gate of the at least one switching FET and biases one of the drain and a source of the at least one shunt FET.

6. The RF device of claim 1 wherein the second control signal drives the gate of the at least one shunt FET and biases one of the drain and the source of the at least one switching FET.

7. The RF device of claim 1 wherein the at least one switching FET includes a resistor disposed between the source of the at least one switching FET and the drain of the at least one switching FET to reduce harmonic distortion.

8. The RF device of claim 1 wherein the microwave switch further includes a first decoupling capacitor disposed along the switching path between the antenna and the at least one switching FET and a second decoupling capacitor disposed along the switching path between the transmit circuit and the at least one switching FET, values of the first and second decoupling capacitors chosen to resonate with bond wires interconnecting the microwave switch.

9. The RF device of claim 1 wherein the characteristic of the at least one switching FET comprises a pinch-off voltage.

10. A radio frequency (RF) device comprising:
an antenna configured to receive an RF signal including receive information;
a receive circuit configured to process the RF signal and extract the receive information; and
a receive microwave switch configured to provide a receive switching path between the antenna and the receive circuit and including at least one switching FET configured to conduct the RF signal between the antenna and the receive circuit in a first mode of operation, at least one shunt FET configured to shunt the RF signal to ground in a second mode of operation, and a controller circuit configured to provide control signals including a first control signal to drive the at least one switching FET between the first mode and the second mode, a second control signal to drive the at least one shunt FET between the second mode and the first mode, a first biasing signal to bias one of a source and a drain of the at least one switching FET, and a second biasing signal to bias one of a source and a drain of the at least one shunt FET, the second biasing signal approximately in accordance with the first control signal.

11. The RF device of claim 10 wherein the second control signal is approximately complementary to the first control signal.

12. The RF device of claim 10 wherein the first biasing signal is approximately in accordance with the second control signal.

13. The RF device of claim 10 further comprising a transmit circuit configured to provide an RF signal including transmit information and a transmit microwave switch configured to provide a transmit switching path between the antenna and the transmit circuit.

14. The RF device of claim 10 wherein the receive microwave switch further includes a drain-source resistor disposed between the drain and the source of the at least one switching FET to reduce harmonic distortion.

15. A method of operating a radio frequency (RF) device, the method comprising:
receiving an RF signal at a first port;
conducting the RF signal between the first port and a second port through at least one switching FET in a first mode of operation and shunting the RF signal through at least one shunt FET to ground in a second mode of operation, operating in the first mode including driving a gate of the at least one shunt FET to turn off the at least one shunt FET, driving a gate of at least one switching FET to turn on the at least one switching FET, and biasing one of a source and a drain of the at least one switching FET to increase a voltage difference between the gate and the drain of the at least one switching FET, operating in the second mode including driving the gate of at least one shunt FET to turn on the at least one shunt FET, driving the gate of at least one switching FET to turn off the at least one switching FET, and biasing a one of a source and a drain of the at least one shunt FET to increase a voltage different between the gate and the drain of the at least one shunt FET; and
processing the RF signal at the second port when operating in the first mode.

16. The method of claim 15 further comprising receiving a switch control signal.

17. The method of claim 16 further comprising generating a first control signal to turn on the at least on switching FET in the first mode and to turn off the at least one switching FET in the second mode, the first control signal based at least in part on the switch control signal.

18. The method of claim 17 further comprising generating a second control signal to turn on the at least one shunt FET in the second mode and to turn off the at least one shunt FET in the first mode, the first and second control signals being approximately complementary signals.

19. The method of claim 18 further comprising generating a first bias signal to increase the voltage difference between the gate and the drain of the at least one switching FET, the first bias signal and the first control signal being approximately complementary signals.

20. The method of claim 19 further comprising generating a second bias signal to increase the voltage difference between the gate and the drain of the at least one shunt FET, the second bias signal and the second control signal being approximately complementary signals.

* * * * *

UNITED STATES PATENT AND TRADEMARK OFFICE
CERTIFICATE OF CORRECTION

PATENT NO.        : 8,729,949 B2                                    Page 1 of 1
APPLICATION NO.   : 13/894773
DATED             : May 20, 2014
INVENTOR(S)       : Nisbet et al.

It is certified that error appears in the above-identified patent and that said Letters Patent is hereby corrected as shown below:

In the Specification

In column 3 at line 56, Change "RF 1" to --RF1--.

In column 5 at line 63, Change "2020N." to --202 ON.--.

In column 5 at line 66, Change "2020N," to --202 ON,--.

In column 8 at line 9, Change "350AI" to --350A1--.

In column 8 at line 39 (approx.), Change "5501G." to --550IG.--.

In column 8 at lines 46-47, Change "integrate" to --intergate--.

In column 8 at line 53, Change "550G 1" to --550G1--.

In the Claims

In column 10 at line 54, In Claim 15, change "different" to --difference--.

In column 10 at line 61, In Claim 17, change "on" to --one--.

Signed and Sealed this
Twenty-eighth Day of October, 2014

Michelle K. Lee
*Deputy Director of the United States Patent and Trademark Office*